US009678333B2

(12) United States Patent
Goren

(10) Patent No.: US 9,678,333 B2
(45) Date of Patent: Jun. 13, 2017

(54) SCANNING MICROMIRROR WITH IMPROVED PERFORMANCE AND RELATED ELECTRONIC DEVICE

(71) Applicant: STMicroelectronics International N.V., Amsterdam (NL)

(72) Inventor: Nir Goren, Moshav Herut (IL)

(73) Assignee: STMICROELECTRONICS INTERNATIONAL N.V., Schiphol (NL)

( * ) Notice: Subject to any disclaimer, the term of this patent is extended or adjusted under 35 U.S.C. 154(b) by 0 days.

(21) Appl. No.: 14/702,833

(22) Filed: May 4, 2015

(65) Prior Publication Data

US 2015/0323782 A1    Nov. 12, 2015

(30) Foreign Application Priority Data

May 7, 2014    (IT) .............................. TO2014A0364

(51) Int. Cl.
 G02B 26/08 (2006.01)
 G02B 26/10 (2006.01)
 B81B 3/00 (2006.01)

(52) U.S. Cl.
 CPC ..... *G02B 26/0833* (2013.01); *G02B 26/0841* (2013.01); *G02B 26/10* (2013.01); *G02B 26/105* (2013.01); *B81B 3/0045* (2013.01)

(58) Field of Classification Search
 CPC ............ G02B 26/0833; G02B 26/0841; G02B 26/085; G02B 26/0858; G02B 26/101; H02N 1/008

USPC ..................... 359/198.1–199.4, 200.6–200.8, 359/213.1–215.1, 221.2, 223.1–226.2
 See application file for complete search history.

(56) References Cited

U.S. PATENT DOCUMENTS

| 7,573,625 B2 * | 8/2009 | Cannon .................... B41J 2/471 359/199.1 |
| 2007/0008401 A1 | 1/2007 | Cannon et al. |
| 2010/0079834 A1 | 4/2010 | Jerman |
| 2011/0248601 A1 | 10/2011 | Pirk et al. |
| 2012/0250129 A1 * | 10/2012 | Nakatani ............ G02B 26/0841 359/200.6 |

FOREIGN PATENT DOCUMENTS

| JP | 2010220344 A | 9/2010 |
| WO | WO-2009024987 A2 | 2/2009 |

OTHER PUBLICATIONS

Italian Search Report and Written Opinion for IT TO2014A000364 mailed Dec. 3, 2014 (9 pages).

* cited by examiner

*Primary Examiner* — James Phan
(74) *Attorney, Agent, or Firm* — Gardere Wynne Sewell LLP

(57) ABSTRACT

A micromechanical mirror includes a mobile mass carrying a mirror element and provided in a body including semiconductor material. A driving structure is coupled to the mobile mass to cause a scanning movement thereof. The driving structure is configured to generate a combination of a two or more sinusoidal resonant modes in the micromechanical mirror at respective resonant frequencies. This combination approximates a scanning pattern of the mobile mass defined by a linear function which may, in particular, be a triangular shaped function.

10 Claims, 5 Drawing Sheets

SCANNING MICROMIRROR WITH IMPROVED PERFORMANCE AND RELATED ELECTRONIC DEVICE

PRIORITY CLAIM

This application claims priority from Italian Application for Patent No. TO2014A000364 filed May 7, 2014, the disclosure of which is incorporated by reference.

TECHNICAL FIELD

The present invention relates to a scanning micromirror with improved performance and to a related electronic device.

BACKGROUND

Micromechanical mirror structures (in short, micromirrors) are known, which are made, at least in part, of semiconductor materials and using MEMS (Micro-Electro-Mechanical Systems) technology.

These micromechanical structures may be integrated in electronic devices, in particular portable or mobile devices, such as, for example, portable computers, laptops, notebooks (including ultra-thin notebooks), PDAs, tablets, phablets, smartphones or wearable devices, for optical operations, for example for directing in desired scanning patterns light radiation beams generated by a light source, e.g. a Laser.

Thanks to the reduced dimensions, these structures enable stringent requirements to be met as regards occupation of space, in terms of area and thickness.

For example, micromirrors are used in miniaturized projector modules (so called "picoprojectors"), which are able to project images at a distance or to generate desired patterns of light, in the visible or infrared spectrum; in barcode scanners; or in laser printers.

Micromirrors generally include: a mirror element, obtained from a body of semiconductor material in such a way as to be movable, for example with a tilting or rotation movement, to direct a incident light beam according to a desired scanning pattern; and a supporting structure, which is also obtained from a body of semiconductor material, is coupled to the mirror element, and has supporting and handling functions. A cavity is made in the supporting structure, underneath, and in a position corresponding to, the mirror element, in such a way as to enable freedom of movement for tilting or rotation thereof.

During operation, application of an AC voltage with a proper frequency causes oscillatory movement at the mechanical resonant frequency of the micromechanical structure. Actuation at the resonant frequency allows high frequency operation, thus allowing to achieve a high scanning speed.

The Applicant has realized that the above discussed driving structure, although advantageous, may not be optimized, at least for some operating conditions.

In particular, due to the sinusoidal pattern of the micromirror movement, it is required to compensate the variation of the scanning speed, when there is a need of projecting light at a uniform intensity level (to achieve a substantially uniform brightness).

Indeed, the sinusoidal micromirror movement is faster at the center of the movement pattern and slower at the edges, so that a suitable modulation of the power and intensity of the light to be projected is required. Accordingly, the power and/or frequency rate of the light source has to be modulated by a suitable control logic to match the speed variation of the micromirror during its scanning pattern.

In particular, this modulation entails lowering of the power of the light source at the edges of the scanning pattern, when the micromirror speed is slower, resulting in a decrease of the total power that is produced at the output.

Indeed, it is possible to show that the light power is about 63%, if compared to the case in which the light source were kept at full power along the entire scanning pattern; the light brightness available at output is thus reduced by about 37%.

Micromirrors of a linear type do exist; however, they are complex to manufacture, entail lower scanning aperture and lower operating speed and generally more complex driving structure.

There is a need in the art to overcome, at least in part, the issues highlighted previously.

SUMMARY

In an embodiment, a driving structure for the micromirror is configured to generate a combination of a number of sinusoidal resonant modes of vibration for the micromirror at respective resonant frequencies, which combination is designed to mimic, or approximate, a linear scanning pattern, thus allowing to achieve both the high speed operation advantages generally associated to a resonance scanning and the high efficiency advantages generally associated to a linear scanning.

In other words, a pseudo-linear scanning pattern is achieved, by combining a number of sinusoidal resonant scans.

According to a possible embodiment, the mirror movement is designed to approximate a triangular, or saw-tooth, shaped linear scan, in order to provide a more uniform speed of the micromirror along the entire scanning pattern.

BRIEF DESCRIPTION OF THE DRAWINGS

For a better understanding of the present invention, preferred embodiments thereof are now described, purely by way of non-limiting example, with reference to the attached drawings, wherein.

DETAILED DESCRIPTION OF THE DRAWINGS

An aspect of the present solution derives from the realization by the Applicant that a substantially linear scanning movement for the micromirror would be desirable in order to increase system efficiency, lower the modulation constraints and improve the overall power output.

Figure 1:
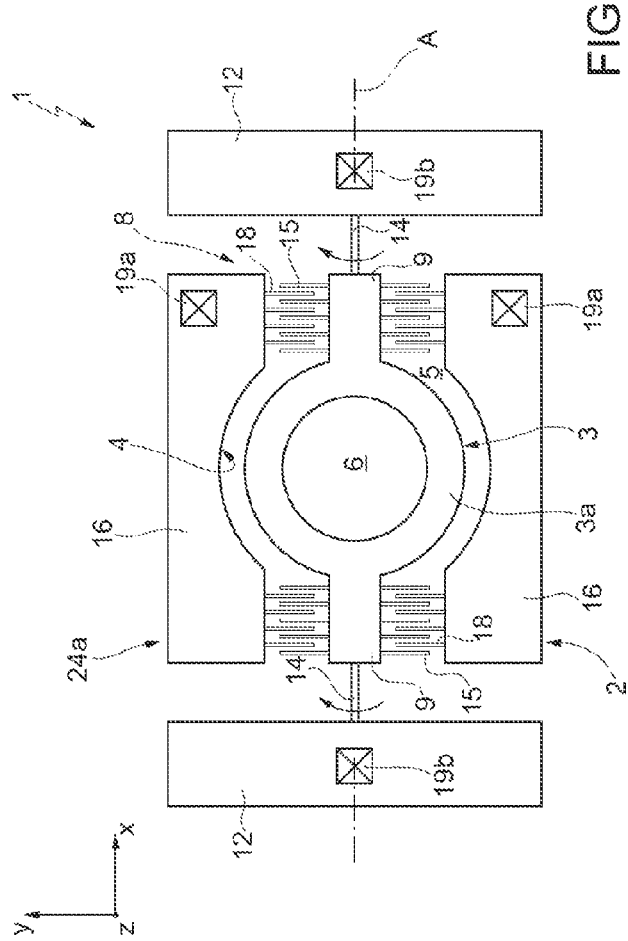
FIG. 1 shows a schematic top plan view of a micromirror.

FIG. 1 schematically shows a micromirror 1 including: a body 2 of semiconductor material, for example silicon, in which a mobile mass 3 is provided, for example by removal of material through chemical etching; the mobile mass 3 has a main extension in a horizontal plane xy and a thickness that is substantially negligible with respect to its extension in the horizontal plane xy along a vertical axis z, orthogonal to the same horizontal plane xy. The mobile mass 3 is surrounded by a trench 4 and suspended above a cavity 5 made in the body 2; in a resting condition, the mobile mass 3 is substantially parallel to, and faces, the bottom surface of the cavity 5 and the horizontal plane xy.

The mobile mass 3 has a central portion 3a, for example circular in plan view (in the horizontal plane xy), having a longitudinal axis; a mirror layer 6, for example again circular in plan view, is placed on the mobile mass 3, being constituted by a material with a high reflectivity with respect to the light radiation to be projected, such as for example aluminum or gold.

The micromirror 1 further comprises a driving structure 8, coupled to the mobile mass 3, and including a couple of driving arms 9, having an elongated shape and extending on opposite sides with respect to the mobile mass 3 along the longitudinal axis, rigidly coupled to the same mobile mass 3. Driving arms 9 may be obtained from the same body 2 of semiconductor material as the mobile mass 3, via suitable etching steps, in this case being integral to the same mobile mass 3.

The driving arms 9 are coupled to anchorages 12, fixed with respect to the body 1 (e.g. to a substrate thereof), by means of elastic elements 14, of a torsional type, which enable rotation thereof out of the horizontal plane xy.

The elastic elements 14 have a longitudinal extension along the first horizontal axis x, and are thin, i.e. having a length along the aforesaid first horizontal axis x that is greater than the corresponding width (along a second horizontal axis y of the horizontal plane xy) and greater than the corresponding thickness along the same vertical axis z.

The elastic elements 14 moreover define, in their direction of extension and alignment, an axis of rotation A for the mobile mass 3, passing through a center of the central portion of the same mobile mass 3.

The aforesaid driving arms 9 carry in a fixed way mobile electrodes 15, shaped like fingers, extending in the horizontal plane xy on opposite sides of the same arms along the second horizontal axis y and within the trench 4.

Driving structure 8 further comprises a fixed portion 16, obtained from the body 2, separated from the mobile mass 3 by the trench 4. The fixed portion 16 carries fixed electrodes 18, which also have a finger-like conformation and a longitudinal extension along the second horizontal axis y, in a position facing and combfingered (interdigitated) with the mobile electrodes 15.

First contact pads 19a and second contact pads 19b are carried by respective top surfaces of the fixed portion 16 and of the anchorages 12, for electrical biasing of the fixed electrodes 18 and, respectively, of the mobile electrodes 15 (through the elastic elements 14).

During operation, application of an AC voltage with a proper frequency between the mobile electrodes 15 and the fixed electrodes 18 causes torsion of the elastic elements 14 and rotation of the mobile mass 3 (and of the associated mirror layer 6) out of the horizontal plane xy about the axis of rotation A, according to the desired movement so as to reflect an incident light beam towards the outside of the micromirror 1, based on a desired scanning pattern.

In particular, the mobile mass 3 is advantageously driven with an oscillatory movement at its mechanical resonant frequency, in order to maximize the extent of its movement given a same electrical biasing, thus generating a sinusoidal scan pattern; the AC voltage is thus applied to the electrodes, at the mechanical resonant frequency of the micromechanical structure.

Actuation at the resonant frequency allows high frequency operation, thus allowing to achieve a high scanning speed.

An aspect of the present solution envisages a driving structure for the micromirror, which is configured to generate a combination of a number of sinusoidal resonant modes of vibration for the micromirror at respective resonant frequencies, which combination is designed to mimic, or approximate, a linear scanning pattern, thus allowing to achieve both the high speed operation advantages generally associated to a resonance scanning and the high efficiency advantages generally associated to a linear scanning.

In other words, a pseudo-linear scanning pattern is achieved, by combining a number of sinusoidal resonant scans.

According to a possible embodiment, the mirror movement is designed to approximate a triangular, or saw-tooth, shaped linear scan, in order to provide a more uniform speed of the micromirror along the entire scanning pattern.

In more details, it is known that a linear function may be seen, according to its series Fourier transform, as the combination of a number of harmonics, i.e. of sinusoidal base functions at respective frequencies.

Figure 2:
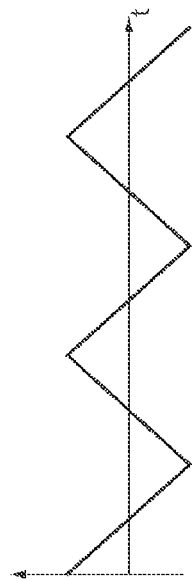
FIG. 2 is a diagrammatic plot of a triangular, or saw-tooth, wave.

In particular, a triangular shaped linear function, as exemplary shown in FIG. 2, may be expressed as:

$$x_{tri}(t) = \frac{8}{\pi^2} \sum_{k=0}^{N} (-1)^k \frac{\sin((2k+1)\omega t)}{(2k+1)^2} =$$

$$\frac{8}{\pi^2} \left( \sin(\omega t) - \frac{1}{9} \left( \sin(3\omega t) + \frac{1}{25} (\sin(5\omega t) - \ldots \right) \right)$$

where $\omega=2\pi f$ (f being a base frequency) and N is an integer number (0 to $\infty$) defining the number of harmonics in the series transform.

Figure 3:
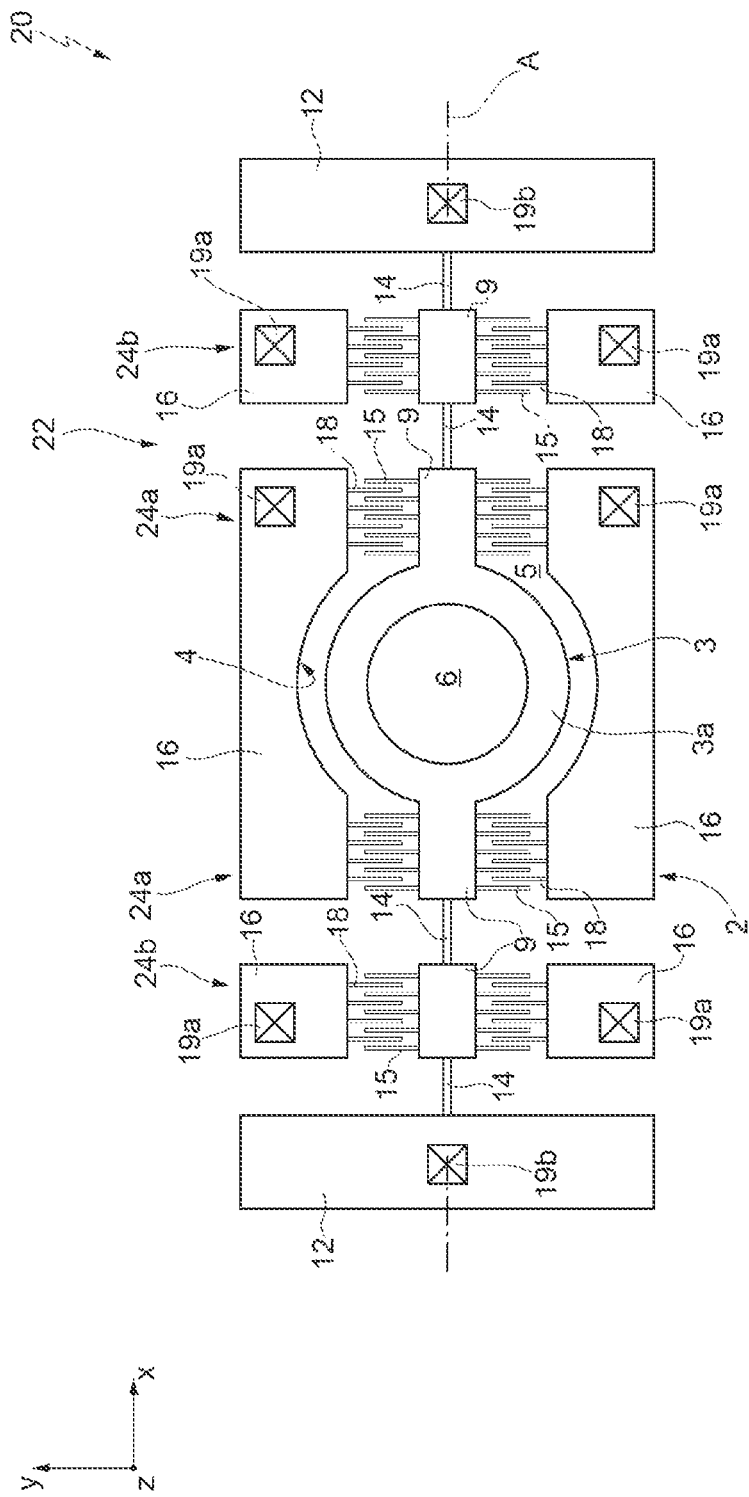
FIG. 3 shows a schematic top plan view of a micromirror.

FIG. 3 (where same reference numbers are used to denote elements similar to others discussed previously, which are here not described again in detail for sake of brevity) shows an embodiment of a micromirror, denoted with 20, providing a combination of two sinusoidal resonant modes (N=2) to achieve a pseudo-linear scanning pattern, in particular in the approximation of a triangular shape.

As previously discussed, micromirror 20 generally includes: a body 2 of semiconductor material, for example silicon, in which a mobile mass 3 is provided, having a mirror layer 6 placed on the central part 3a thereof (the mobile mass 3 is, for example, circular in plan view, and so is the mirror layer 6).

In particular, the driving structure coupled to the mobile mass 3, here denoted with 22, includes a number of driving groups, one for each resonant mode of the micromirror 20, which are denoted with 24a, 24b.

Each driving group 24a, 24b includes a respective couple of driving arms 9 and associated mobile electrodes 15; and moreover a respective fixed portion 16, carrying fixed electrodes 18, in a position facing and combfingered with the mobile electrodes 15 (fixed portions 16 are here shown as distinct, for each driving group 24a, 24b; however, a common fixed portion 16 could alternatively be envisaged, provided that each group of electrodes is biased at a different potential). In a way not shown, fixed portions 16 may be connected at the bottom to a common substrate of the body 2, via an insulating layer.

Driving arms 9 of a first driving group 24a have first ends directly coupled to the mobile mass 3, extending on opposite sides with respect thereto along its rotation axis A; while driving arms 9 of a second driving group 24b have respective first ends coupled to anchorages 12, fixed with respect to the body 2, by means of elastic elements, again denoted with 14, of a torsional type.

Moreover, second ends of the driving arms 9 of the first group 24a are coupled to respective second ends of the driving arms of the second group 24b by means of respective elastic elements, also denoted with 14, and again being of a torsional type (these elastic elements 14 thus elastically coupling together the driving arms 9 of the first and second groups 24a, 24b).

The elastic elements 14 together define, in their direction of extension and alignment, the axis of rotation for the mobile mass 3, passing through the center of the central portion 3a of the same mobile mass 3.

The fixed portions 16 moreover carry respective first contact pads 19a, for biasing of the respective fixed electrodes 18, while second contact pads 19b are coupled to the anchorages 12, for electrical biasing of the mobile electrodes 15 (through the elastic elements 14).

During operation, suitable driving signals $Sd_1$, $Sd_2$ are provided to the first and second driving groups 24a, 24b, via the respective contact pads 19a, so as to generate a suitable difference of potential between the respective mobile electrodes 15 and fixed electrodes 18, to cause a torsion of the respective elastic elements 14.

In particular, the first and second driving groups 24a, 24b are configured so that the resulting scanning pattern, or movement, of the micromirror 20 is a combination of two resonant modes, corresponding to respective harmonics in the series Fourier transform of a linear function, in particular of a triangular shaped function.

In this case, the two resonant modes of the micromechanical structure may be at frequencies f and 3*f (f being a base frequency for micromirror 20, e.g. equal to 20 kHz), so as to obtain the first two harmonics of the series Fourier transform of a triangular wave.

Driving signals $Sd_1$, $Sd_2$ may therefore be AC voltage signals at resonant frequencies f and 3*f.

In particular, proper design of the mechanical characteristics of the driving groups 24a, 24b, e.g. in terms of one or more of the stiffness, spring constant and configuration of the elastic elements 14 and/or size, mass and moment of inertia of the driving arms 9, allows to define the resonant modes of the driving structure 22.

An example of a possible design of a resonating micromirror 20 of base frequency f=20 KHz and with two elements of the Fourier series (as shown in the above referenced FIG. 3) is now presented.

It is known that the torsion resonance frequency is, in a first approximation, a function of the expression:

$$\sqrt{\frac{K}{J}}$$

equal to $2\pi K$ where K is the spring constant (in this case of the elastic elements 14), e.g. in N*m units, and J is the moment of inertia of the moving element (in this case of the driving arms 9), e.g. in Kg*m² Kg×m² units.

Since the internal resonance system (defined by the driving group 24a nearer to the mobile mass 3) has a lower value of J, the same driving group 24a may be designed with the higher frequency, in the example 3f (e.g. 60 KHz), and the external resonance driving group 24b with the lower frequency, in the example f (e.g. 20 KHz).

The internal driving group 24a may for example be designed with parameters equal or proportional to the following values: $K_1 = 10^{-6}$ N×m and $J_1 = 1.097 \times 10^{-14}$ Kg×m²; and the external driving group 24b, having higher moment of inertia, for example $J_2 = 1.6455 \times 10^{-14}$ Kg×m², may be designed with a spring constant $K_2$ equal or proportional to $0.167 \times 10^{+6}$ N×m.

Figure 4:
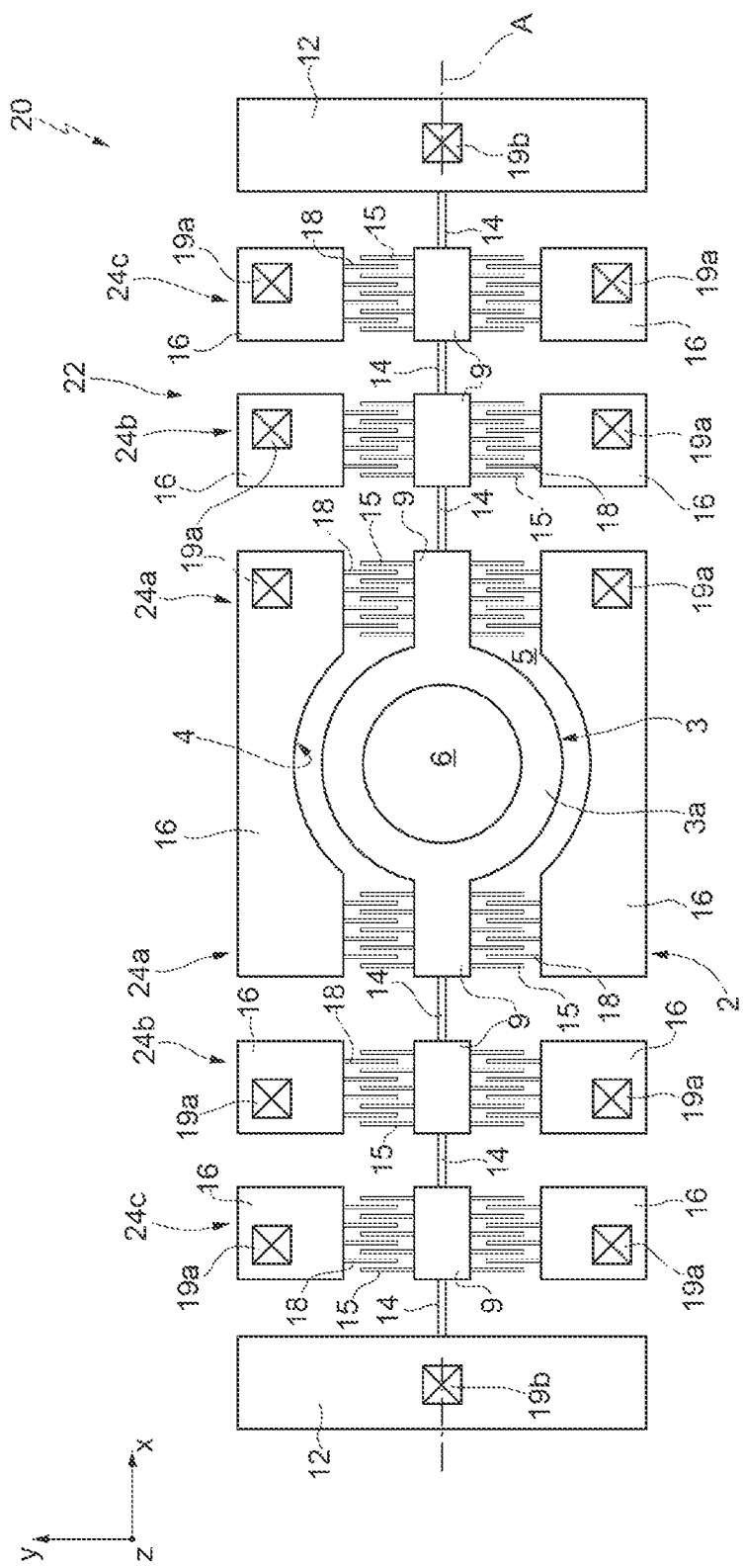
FIG. 4 shows a schematic top plan view of a micromirror.

FIG. 4 shows a second embodiment of a micromirror, again denoted with 20, providing a combination of three sinusoidal resonant modes (N=3), e.g. corresponding to the first three resonant modes (at resonant frequencies f, 3*f and 5*f) of the series Fourier transform of a triangular wave.

In this case, micromirror 20 includes three driving groups, 24a, 24b and 24c, each receiving a respective driving signal $Sd_1$, $Sd_2$, $Sd_3$ so as to generate the desired combination of resonant modes. In particular, driving arms 9 of third driving group 24c are interposed between the driving arms 9 of the first and second driving groups 24a, 24b along the axis of rotation A of the micromirror 20.

Figure 5:
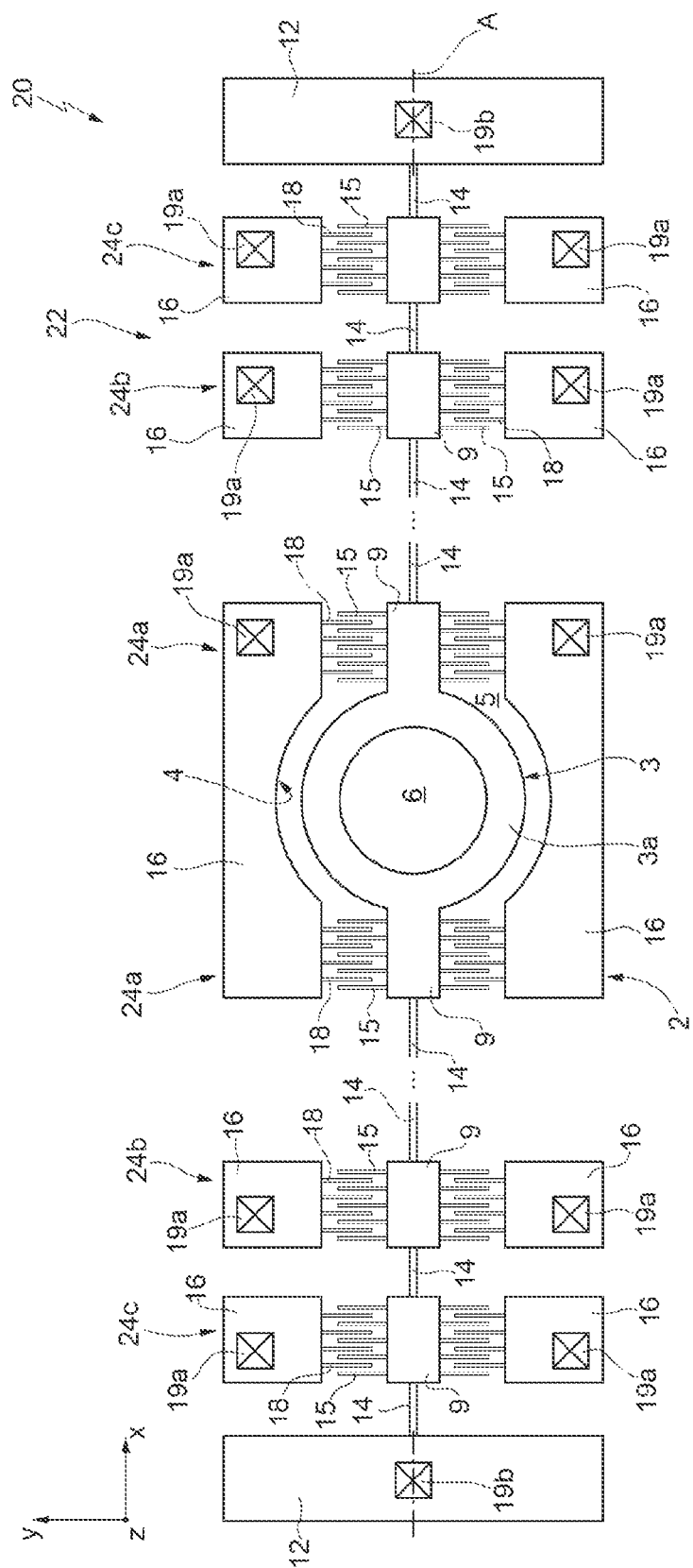
FIG. 5 shows a schematic top plan view of a micromirror.

FIG. 5 instead shows schematically how a different number N (N>3) may also be envisaged, in order to improve the accuracy of approximation of the linear function by the combination of sinusoidal modes (at the expense, however, of an increase in the complexity of the resulting driving structure and size occupation thereof).

In general, each additional driving group 24 introduces an additional element of the Fourier series to the overall mirror movement; the more driving groups, the more elements of the Fourier series are added, and the closer the movement comes to an ideal triangular wave (again, at the expense of the complexity of the structure).

Tests and simulations carried out by the Applicant have shown a marked increase in the efficiency of the micromirror 20, with respect to a traditional solution (with simple sinusoidal resonant drive), as shown in Table 1 below, where the efficiency and relative improvement of the present solution, with different values of N (2, 3 and 4), are compared to the sinusoidal traditional solution (N=1).

TABLE 1

| N | Efficiency | Improvement |
|---|---|---|
| 1 | 64% | |
| 2 | 75% | 18% |
| 3 | 79% | 23% |
| 4 | 80% | 26% |

As highlighted by the above results, the increased linearity allows a more uniform speed of the micromirror 20 along the scanning pattern; accordingly, it is required a lower decrease of the driving power (or modulation rate) of the light source, and a higher efficiency may thus be achieved.

Figure 6:
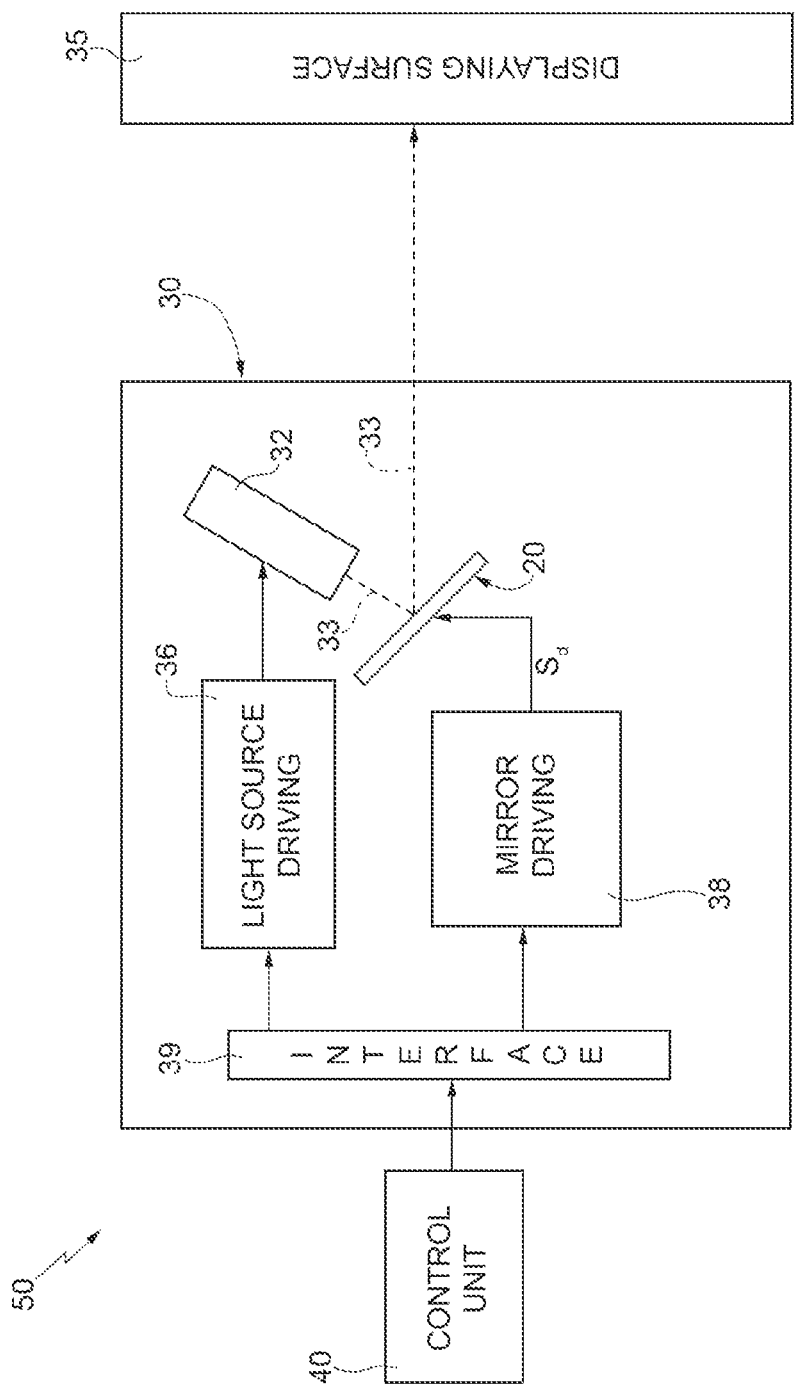
FIG. 6 is a schematic block diagram of an electronic device incorporating the micromirror.

FIG. 6 shows an electronic device, denoted with 30, incorporating the micromirror 20; in the example, the electronic device 30 is a picoprojector device, designed to be functionally coupled to a portable electronic apparatus 50 (such as a portable computer, a laptop, a notebook, a PDA, a tablet, a phablet, a smartphone or a wearable device).

The electronic device 30 comprises: a light source 32, for example, of a laser type, designed to generate a light beam 33; the micromirror 20, designed to receive the light beam 33 and to direct it towards a screen or displaying surface 35 (external to, and set at a distance from, the electronic device 30); a first driving circuit 36, designed to supply suitable driving signals to the light source 32, for generation of the light beam 33 as a function of an image to be projected; a second driving circuit 38, designed to supply suitable driving signals to the micromirror 20 according to the desired scanning scheme, for projection of the image on the displaying surface 35 (in particular providing driving signals $Sd_1$, $Sd_2$, $Sd_3$, ... $Sd_N$); and a communication interface 39, designed to receive, from an external control unit 40, for example, included in the portable apparatus 50, information on the image to be generated, for example, in the form of an array of pixels. This information is sent at input to the first and second driving circuits 36, 38, for driving, respectively, the light source 32 and the micromirror 20, as a function thereof.

The advantages of the discussed solution are clear from the foregoing description.

In any case, it is once again emphasized that it allows to increase the system efficiency, lower the adjustments required to the light source in order to achieve a uniform performance, and improve the overall power output, with respect to traditional solutions.

These advantages are all the more relevant in case of portable applications, where the efficiency and energy performance are important design requirements.

Finally, it is clear that modifications and variations may be made to what is described and illustrated herein, without thereby departing from the scope of the present invention, as defined in the appended claims.

In particular, as previously discussed, the number N of driving groups in the micromirror 20, and corresponding resonant driving modes, may differ from what preciously discussed and shown, according to the specific operating requirements.

Moreover, driving of the mobile mass 3 could also be obtained employing a different technique, for example a piezoelectric or a magnetic technique (in a known manner, here not discussed in detail).

The micromirror 20 may in general be used for any optical system, in portable, or even fixed, electronic apparatus that requires, for example, reflection of a light beam.

What is claimed is:

1. A micromechanical mirror, comprising:
a mobile mass carrying a mirror element and provided in a body including semiconductor material; and
a driving structure coupled to the mobile mass and configured to cause a scanning movement thereof;
wherein the driving structure is configured to generate a combination of a plurality of sinusoidal resonant modes in the micromechanical mirror at respective plural resonant frequencies, said combination approximating a scanning pattern of said mobile mass defined by a linear function;
wherein the driving structure includes a plurality of distinct driving groups corresponding in number to the plurality of sinusoidal resonant modes;
wherein each of said driving groups includes:
a respective pair of driving arms arranged on opposite sides of the mobile mass with respect to a rotation axis thereof and carrying mobile electrodes;
a respective fixed portion carrying fixed electrodes in a position facing and combfingered with the mobile electrodes; and
elastic elements coupled between the driving arms.

2. The micromechanical mirror according to claim 1, wherein the linear function is a triangular shaped function.

3. The micromechanical mirror according to claim 1, wherein the plurality of sinusoidal resonant modes correspond to respective harmonics of a frequency transform of the linear function of said scanning pattern.

4. The micromechanical mirror according to claim 1, wherein said plurality of sinusoidal resonant modes is equal to two or three, and said plurality of sinusoidal resonant modes correspond to the first two or three harmonics of a series Fourier transform of the linear function of said scanning pattern.

5. The micromechanical mirror according to claim 1, wherein the elastic elements are of a torsional type.

6. The micromechanical mirror according to claim 1, wherein the pair driving arms of a first driving group are integrally coupled to the mobile mass; and wherein the pair of driving arms of a second driving group are coupled to anchorages fixed to the body through respective elastic elements.

7. The micromechanical mirror according to claim 1, wherein the fixed portions carry first contact pads for biasing of the respective fixed electrodes at a respective one of different driving signals.

8. The micromechanical mirror according to claim 7, wherein the driving signals are sinusoidal signals at the resonant frequencies of the respective resonant modes.

9. The micromechanical mirror according to claim 1, wherein mechanical parameters of the driving arms and elastic elements of the driving groups define the resonant frequencies of said resonant modes.

10. The micromechanical mirror according to claim 9, wherein said mechanical parameters comprise: a spring constant of the elastic elements and a moment of inertia of the driving arms.

* * * * *

UNITED STATES PATENT AND TRADEMARK OFFICE
CERTIFICATE OF CORRECTION

PATENT NO. : 9,678,333 B2
APPLICATION NO. : 14/702833
DATED : June 13, 2017
INVENTOR(S) : Nir Goren Page 1 of 1

It is certified that error appears in the above-identified patent and that said Letters Patent is hereby corrected as shown below:

On the Title Page

The named Assignee in Item (73) should be corrected as follows:
(73) Assignee: STMicroelectronics Ltd, Netanya (IL)

In the Specification

At Column 6, Line number 9, please replace the equation [[$0.167 \times 10^{+6} \, N \times m$]] with the correct equation -- $0.167 \times 10^{-6} \, N \times m$ --.

Signed and Sealed this
Tenth Day of April, 2018

Andrei Iancu
*Director of the United States Patent and Trademark Office*